(12) United States Patent
Lee et al.

(10) Patent No.: US 7,129,131 B2
(45) Date of Patent: Oct. 31, 2006

(54) METHOD FOR FABRICATING CAPACITOR OF SEMICONDUCTOR DEVICE

(75) Inventors: Nam-Jae Lee, Ichon-shi (KR); Kye-Soon Park, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 46 days.

(21) Appl. No.: 10/741,787

(22) Filed: Dec. 18, 2003

(65) Prior Publication Data

US 2004/0262662 A1   Dec. 30, 2004

(30) Foreign Application Priority Data

Jun. 30, 2003   (KR) ...................... 10-2003-0043072

(51) Int. Cl.
*H01L 21/8242*   (2006.01)

(52) U.S. Cl. ...................... 438/244; 438/239; 438/243; 438/386; 438/387

(58) Field of Classification Search ................ 438/239, 438/243, 244, 250, 253, 254, 386, 387, 393, 438/396, 397, 398

See application file for complete search history.

(56) References Cited

U.S. PATENT DOCUMENTS

| 5,518,948 A | * | 5/1996 | Walker ........................ 438/396 |
| 5,759,892 A | | 6/1998 | Wang |
| 5,981,377 A | | 11/1999 | Koyama |
| 6,015,733 A | * | 1/2000 | Lee et al. .................... 438/253 |
| 6,277,726 B1 | | 8/2001 | Kitch et al. |
| 6,483,141 B1 | * | 11/2002 | Sano .......................... 257/306 |
| 6,528,411 B1 | | 3/2003 | Kakuhara |
| 2001/0023100 A1 | * | 9/2001 | Hong et al. ................. 438/253 |

FOREIGN PATENT DOCUMENTS

| JP | 9-306989 | 11/1997 |
| JP | 10-163124 | 6/1998 |
| JP | 2001-210803 | 8/2001 |

\* cited by examiner

*Primary Examiner*—Kevin M. Picardat
(74) *Attorney, Agent, or Firm*—Blakely Sokoloff Taylor & Zafman

(57) ABSTRACT

A method for fabricating a capacitor of a semiconductor device. The semiconductor device includes: a bit line structure formed on a substrate and including stacked layers of a bit line, a hard mask and a spacer. The spacer is formed along a profile containing the bit line and the hard mask. A first inter-layer insulation layer is deposited on an entire surface of the bit line structure. A storage node contact plug is formed on the substrate by passing through the inter-layer insulation layer and having a partially etched portion. A second inter-layer insulation layer is formed on a partial portion of the first inter-layer insulation layer and the storage node contact plug. A lower electrode having a circular shape is formed on lateral sides of the second inter-layer insulation layer, an exposed portion of the first inter-layer insulation layer and the partially etched portion of the storage node contact plug, wherein the lower electrode electrically contacts at least a predetermined lateral side of the partially etched portion.

5 Claims, 7 Drawing Sheets

METHOD FOR FABRICATING CAPACITOR OF SEMICONDUCTOR DEVICE

FIELD OF THE INVENTION

The present invention relates to a method for fabricating a semiconductor device; and, more particularly to a method for fabricating a capacitor having a lower electrode with a circular shape.

DESCRIPTION OF RELATED ARTS

A capacitor used in a memory cell includes a lower electrode for a storage node, a dielectric layer and an upper electrode for use in a plate. Herein, the lower electrode is generally formed in an elliptical shape from a top view. However, this shape of the capacitor has a limitation in securing process margins for a photolithography process or an etching process due to a current trend in a micronized pattern as a result of large-scale of integration. Thus, the lower electrode is formed in a circular shape using a technology which is applicable below about 100 nm.

With reference to FIGS. 1A to 1G, a conventional method for fabricating a capacitor of a semiconductor device with the application of the circularly shaped lower electrode will be described.

Referring to FIG. 1A, a bit line structure formed by sequentially stacking a bit line 11 and a bit line hard mask 12 is formed on a substrate 10. As shown, there are numerous bit line structures formed on the substrate 10. Then, a spacer 13 is formed along a profile containing the bit line structures. Next, an inter-layer insulation layer 14 is formed on an entire surface of the above resulting structure. The inter-layer insulation layer 14 and the spacer 13 are etched to expose portions of the substrate 10. From this etching, contact holes are formed. Thereafter, a first polysilicon layer as a storage node contact plug material is formed on the inter-layer insulation layer 14 such that the first polysilicon layer is filled into each contact hole. The first polysilicon layer is etched by using a chemical mechanical polishing (CMP) process or an etch-back process to expose a surface of the inter-layer insulation layer 14. From this etching of the first polysilicon layer, a plurality of first storage node contact plugs 15 contacted to the substrate 10 are formed. Afterwards, on top of the resulting structure, an isolating oxide layer 16 is formed with a thickness of about 2000 Å.

Referring to FIG. 1B, the isolating oxide layer 16 is etched by using an additional elliptical mask for use in a storage node contact plug (hereinafter referred to as the storage node contact plug mask) to form elliptical holes. Herein, the storage node contact plug mask exposes the contact plugs and partial portions of the inter-layer insulation layer 14. Then, a second polysilicon layer 17 is deposited as an additional storage node contact plug material. At this time, the second polysilicon layer 17 is also filled into the elliptical holes.

As shown in FIG. 1C, the second polysilicon layer 17 is etched by performing an etch-back process until the isolating oxide layer 16 is exposed. From this etch-back process, a plurality of second storage node contact plugs 17A having an elliptical shape and being contacted to each first storage node contact plug 15 are formed.

Referring to FIG. 1D, a nitride layer 18 and a capacitor oxide layer 19 are sequentially deposited on the above entire structure. Also, a third polysilicon layer 20 which will be used as a hard mask is deposited on the capacitor oxide layer 19.

Subsequently, as shown in FIG. 1E, a hard mask 20A is formed by etching the third polysilicon layer 20 with use of a circularly shaped mask for use in a lower electrode exposing completely one side of each elliptically shaped second storage node contact plug 17A. Thereafter, the capacitor oxide layer 19 is selectively etched by using the hard mask 20A.

Referring to FIG. 1F, the hard mask 20A and exposed portions of the nitride layer 18 are sequentially removed to form circularly shaped holes 21 for use in a lower electrode (hereinafter referred to as the lower electrode hole).

Next, referring to FIG. 1G, a fourth polysilicon layer 22, which is used as a lower electrode material, is deposited along a profile containing the lower electrode holes 21 and the capacitor oxide layer 19. Although not illustrated, the fourth polysilicon layer 22 is separated to form lower electrodes having a circular shape from a top view and simultaneously contacting to the second storage node contact plug 17A. Thereafter, a dielectric layer and an upper electrode are sequentially deposited on each lower electrode, completing the capacitor formation.

However, for the formation of the circular lower electrodes, it is necessary to form additionally the elliptical storage node contact plugs after the formation of the first storage node contact plugs in order to secure a contact area between the first storage node contact plug and the lower electrode. Therefore, an additional mask is needed to be formed accompanying additional deposition and etching processes. Accordingly, it may be disadvantageous that processes become complicated and manufacturing costs increase.

SUMMARY OF THE INVENTION

It is, therefore, an object of the present invention to provide a method for fabricating a capacitor of a semiconductor device capable of improving contact characteristics, simplifying processes and reducing manufacturing costs by eliminating an additional formation of a storage node contact plug and simultaneously securing a contact area between a storage node contact plug and a lower electrode during formation of a lower electrode having a circular shape.

In accordance with an aspect of the present invention, there is provided a semiconductor device, including: a bit line structure formed on a substrate and including stacked layers of a bit line, a hard mask and a spacer, the spacer formed along a profile containing the bit line and the hard mask; a first inter-layer insulation layer deposited on an entire surface of the bit line structure; a storage node contact plug formed on the substrate by passing through the inter-layer insulation layer and having a partially etched portion; a second inter-layer insulation layer formed on a partial portion of the first inter-layer insulation layer and the storage node contact plug; and a lower electrode having a circular shape and formed on lateral sides of the second inter-layer insulation layer, an exposed portion of the first inter-layer insulation layer and the partially etched portion of the storage node contact plug, wherein the lower electrode electrically contacts at least a predetermined lateral side of the partially etched portion.

In accordance with another aspect of the present invention, there is provided a method for fabricating a capacitor of a semiconductor device, including the steps of: forming a plurality of storage node contact plugs on a substrate such that each storage node contact plug is isolated by a first inter-layer insulation layer; depositing a barrier layer, a second inter-layer insulation layer for forming a lower electrode and a hard mask on an entire surface of a substrate structure; forming holes for use in the lower electrode by etching the barrier layer and the second inter-layer insulation layer for forming the lower electrode with use of the hard mask as an etch mask, each hole having a circular shape and exposing one side of each storage node contact plug; performing an etch back process to remove the hard mask and a partial portion of each storage node contact plug exposed within the individual hole for use in the lower electrode; and depositing a material for use in the lower electrode into the removed partial portion of each storage node contact plug.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Hereinafter, descriptions on a method for fabricating a capacitor of a semiconductor device will be provided with reference to the accompanying drawings.

FIGS. 2A to 2E are cross-sectional views of a capacitor fabricated in accordance with the present invention.

Figure 1A:
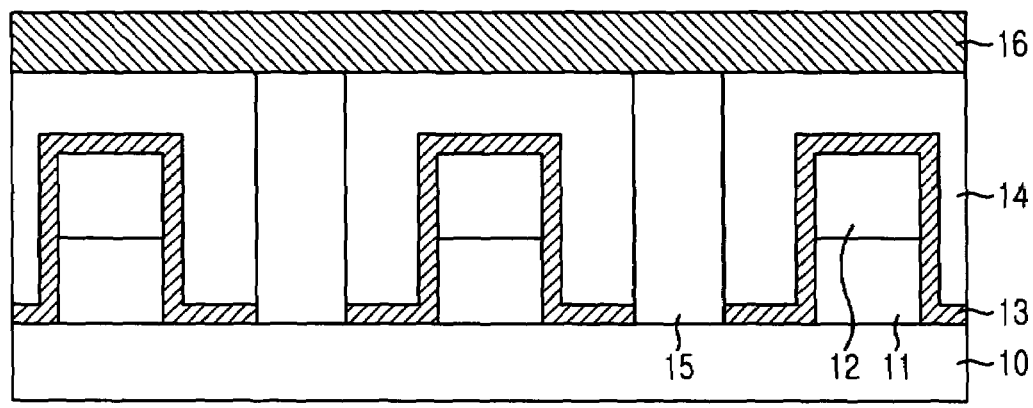
FIGS. 1A to 1G are cross-sectional views of a conventional capacitor.
Figure 1B:
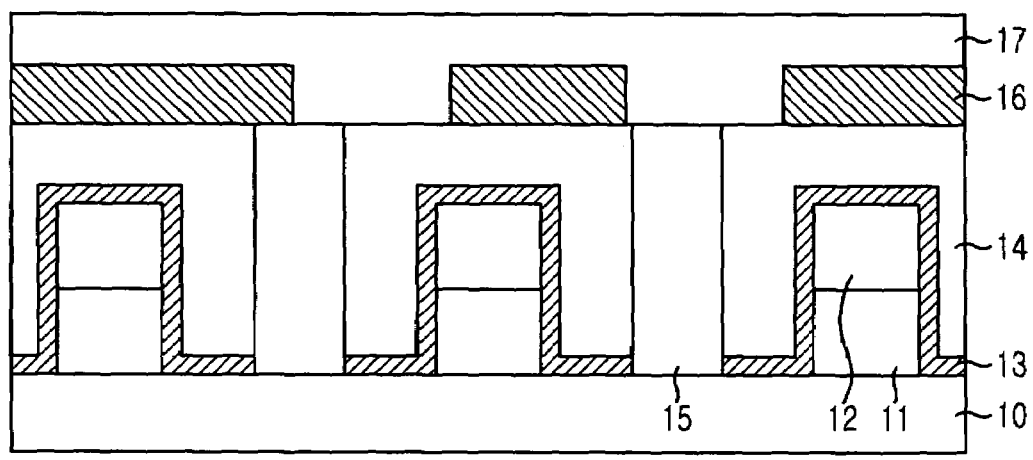
Figure 1C:
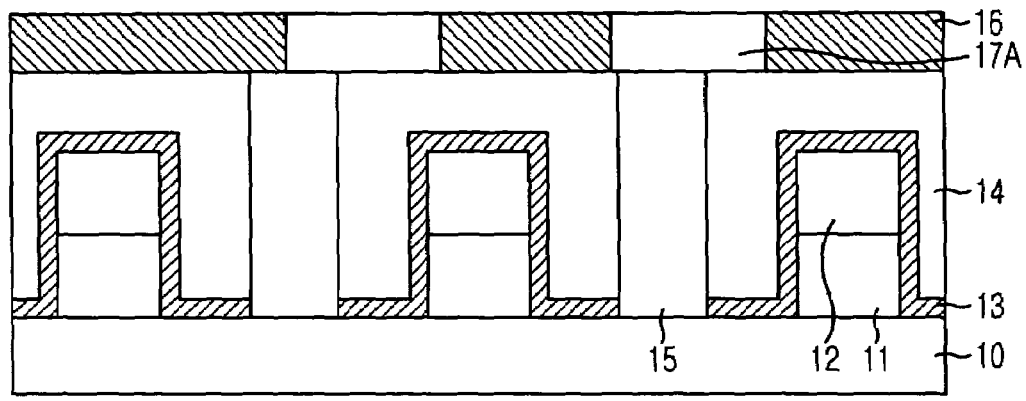
Figure 1D:
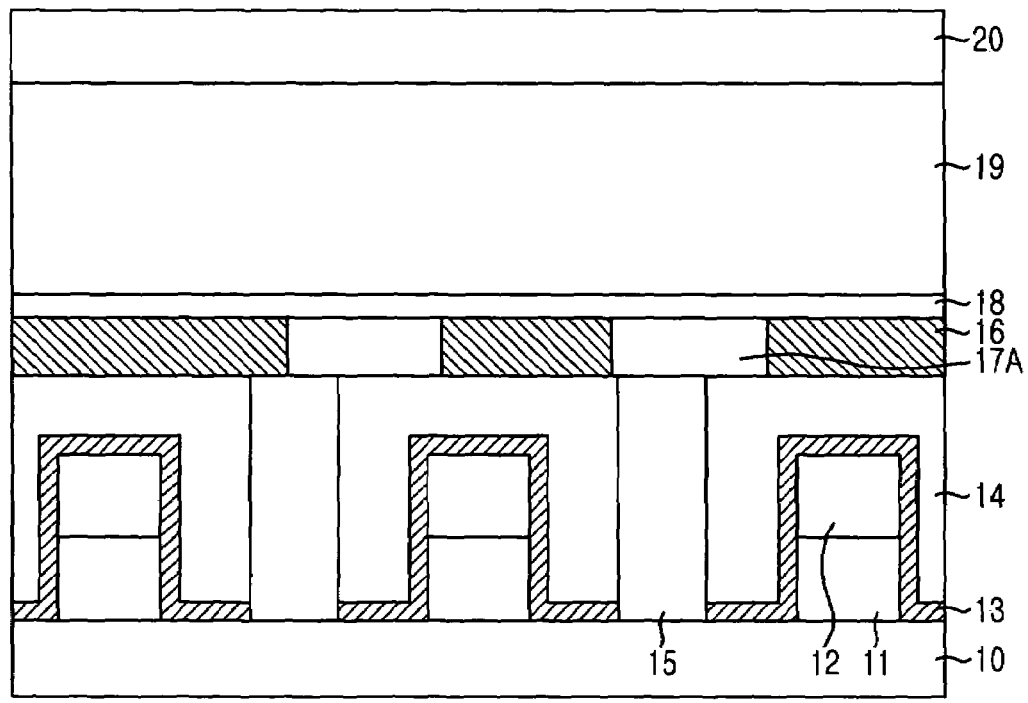
Figure 1E:
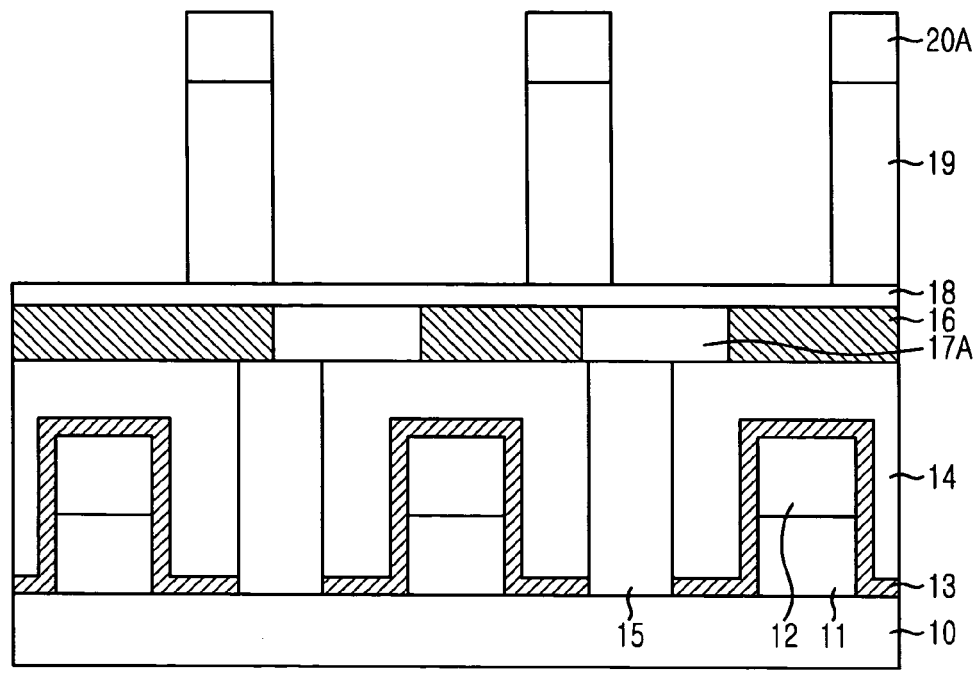
Figure 1F:
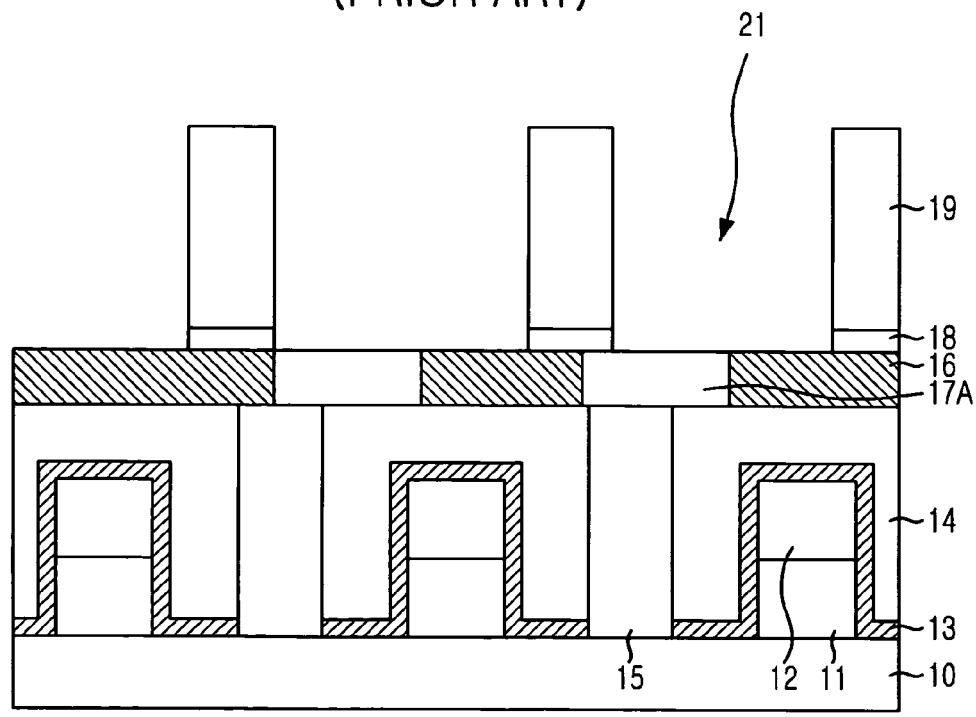
Figure 1G:
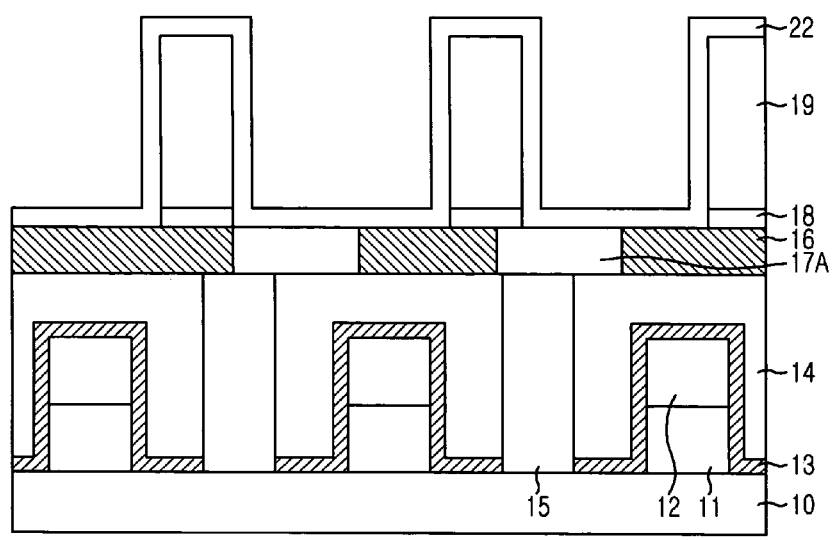
Figure 2A:
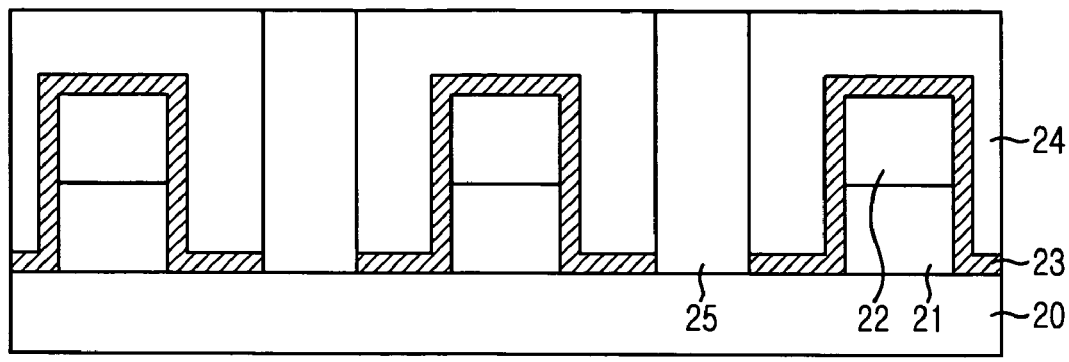
FIGS. 2A to 2E are cross-sectional views of a capacitor of a semiconductor device in accordance with a preferred embodiment of the present invention.

Referring to FIG. 2A, a bit line 21 and a bit line hard mask 22 are sequentially stacked on a substrate 20 to form a bit line structure. Herein, as shown, a plurality of the bit line structures are formed. Then, a bit line spacer 23 is formed along a surface of the substrate 20 and the bit line structures. A first inter-layer insulation layer 24 is formed on an entire surface of the substrate such that the first inter-layer insulation layer 24 covers the bit line structures. Thereafter, the first inter-layer insulation layer 24 and the bit line spacer 23 are etched to form contact holes. This etching continues until a partial portion of the substrate 20 is exposed. A first polysilicon layer is deposited on the first inter-layer insulation layer 24 as a storage node contact plug material. At this time, the first polysilicon layer is deposited such that it is filled into the contact holes. Then, the first polysilicon layer is etched by using a chemical mechanical polishing (CMP) process or an etch-back process to expose the first inter-layer insulation layer 24. From this etching, a plurality of storage node contact plugs 25 contacting to the substrate 20 are formed.

Figure 2B:
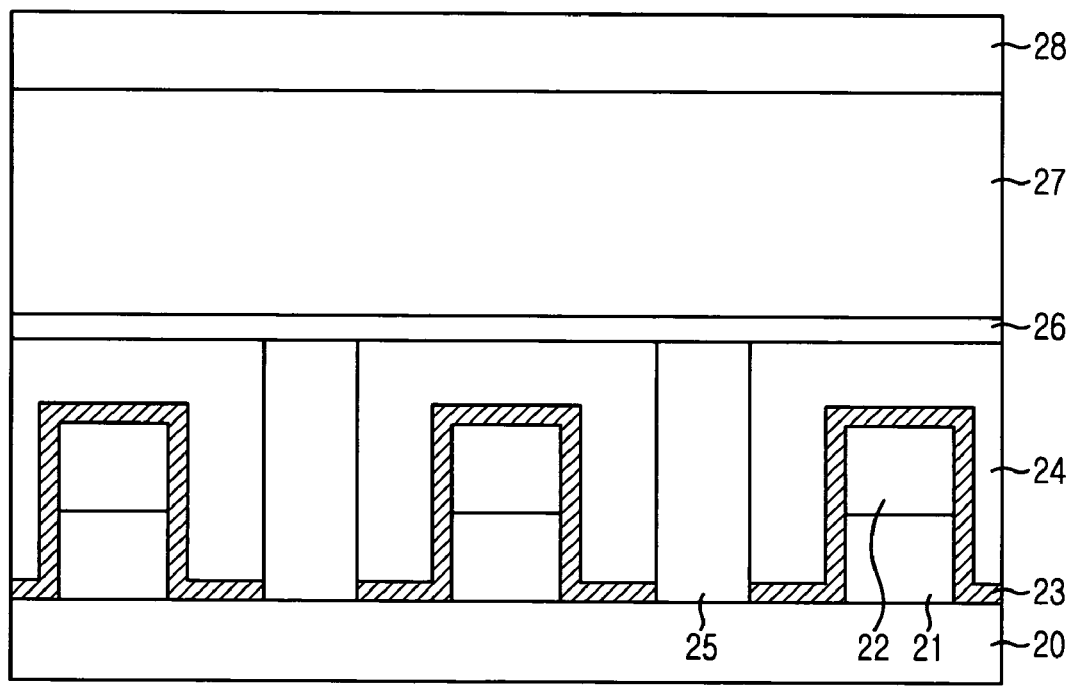

Referring to FIG. 2B, a nitride layer 26 and a capacitor oxide layer 27 are sequentially deposited on an entire surface of the above structure. A second polysilicon layer 28 is deposited on the capacitor oxide layer 26 as a hard mask material.

Figure 2C:
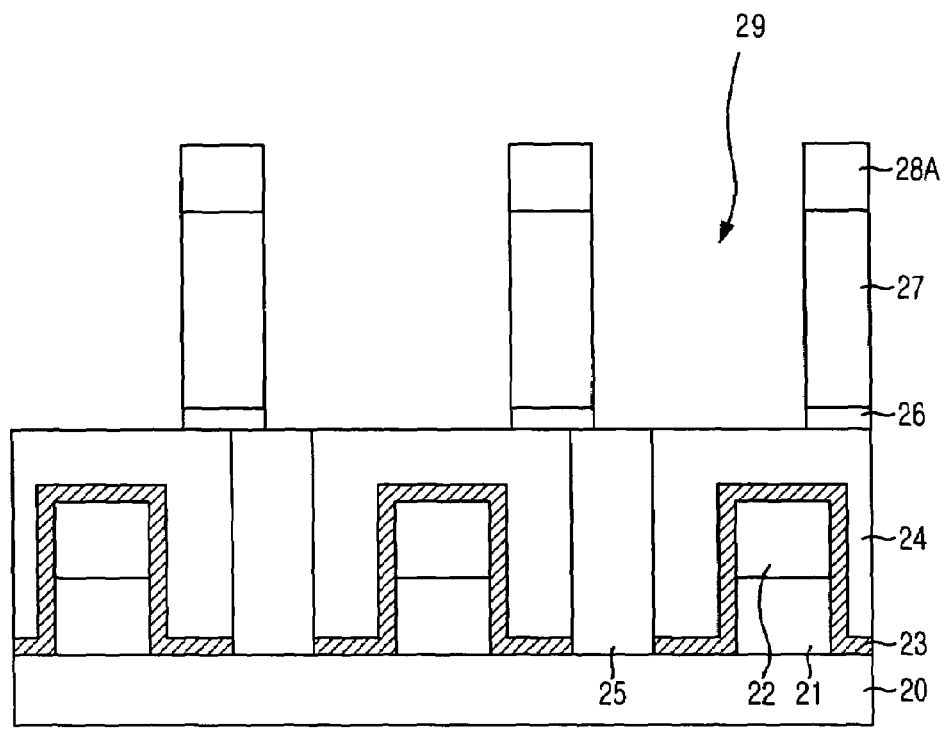

Referring to FIG. 2C, the second polysilicon layer 28 is then etched by using a mask for use in a circular lower electrode (hereinafter referred to as the lower electrode mask) to form hard masks 28A. At this time, the lower electrode mask exposes one side of each storage node contact plug 25. The capacitor oxide layer 27 and the nitride layer 26 are sequentially etched as a second inter-layer insulation layer by using the hard masks 28A to form holes 29 for use in a lower electrode (hereinafter referred to as the lower electrode holes). The lower electrode holes 29 are formed in a circular shape. Herein, the exposure of the one side of each storage node contact plug 25 proceeds within a range from about 0.1% to about 50% of the total depth of each storage node contact plug.

Figure 2D:
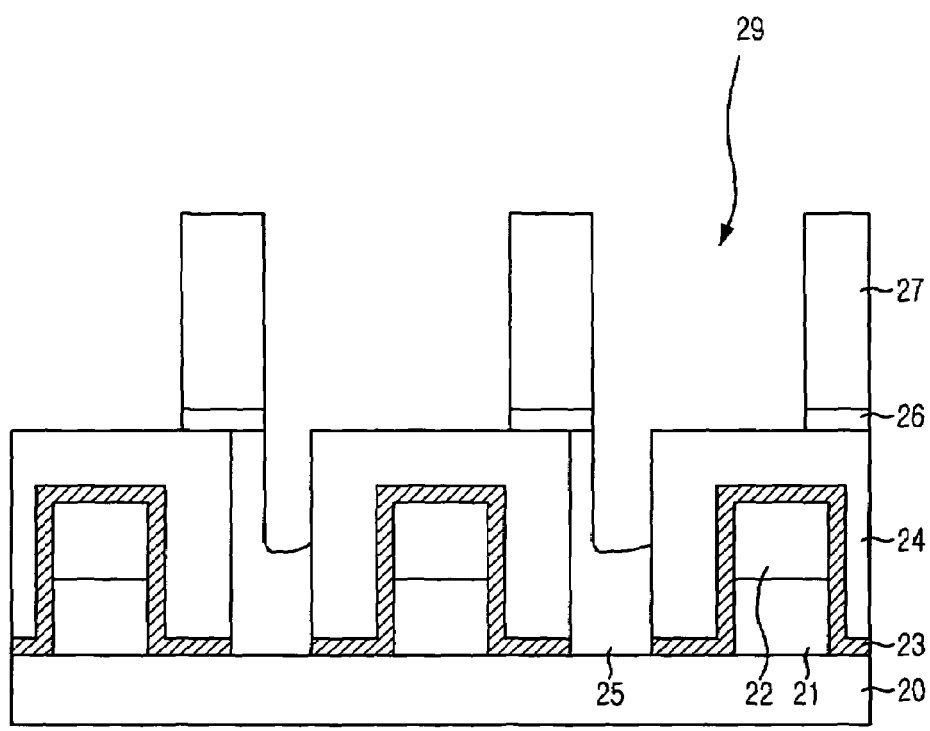

Referring to FIG. 2D, an etch-back process is performed to remove the hard masks 28A and partial portions of the storage node contact plugs 25 exposed within the lower electrode holes 29. Particularly, the partial portions of the storage node contact plugs 25 are etched to a depth preferably as much as the thickness of the hard mask 28A owing to the fact that the hard mask 28A and the storage node contact plug 25 are made of the same material. At this time, the above etching continues until each storage node contact plug 25 makes a sufficient electric contact with a subsequently deposited third polysilicon layer 30 through a lateral side of each etched portion of the individual storage node contact plug 25.

Figure 2E:
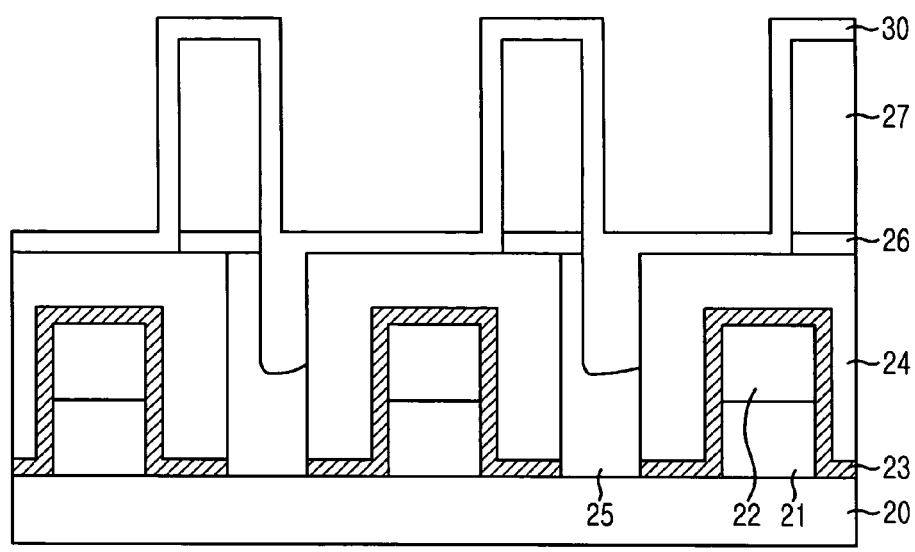

Next, as shown in FIG. 2E, the third polysilicon layer 30 for a lower electrode is deposited along the surfaces of the lower electrode holes 29 and the capacitor oxide layer 27. At this time, the third polysilicon layer 30 is currently filled into each storage node contact plug 25. Although not illustrated, the third polysilicon layer 30 is separated to form lower electrodes each contacting lateral sides of each storage node contact plug 25 and simultaneously having a circular shape from a top view. Thereafter, a dielectric layer and an upper electrode are formed on each lower electrode, completing the capacitor formation.

Based on the above preferred embodiment, it is not necessary to form an additional storage node contact plug. The reason for this result is because the circular lower electrode is formed to make a contact to the lateral sides of the storage node contact plug after a sidewall of the storage node contact plug exposed within the lower electrode hole is partially removed during the removal of the hard mask. This fact makes it possible to secure sufficiently a contact area between the storage node contact plug and the lower electrode. As a result, it is further possible to improve contact characteristics, simplify processes and reduce manufacturing costs.

While the present invention has been described with respect to certain preferred embodiments, it will be apparent to those skilled in the art that various changes and modifications may be made without departing from the scope of the invention as defined in the following claims.

What is claimed is:

1. A method for fabricating a capacitor of a semiconductor device, comprising the steps of:
    forming a plurality of storage node contact plugs on a substrate such that each storage node contact plug is isolated by a first inter-layer insulation layer;
    depositing a barrier layer, a second inter-layer insulation layer for forming a lower electrode and a hard mask on an entire surface of a substrate structure;
    forming holes for use in the lower electrode by etching the barrier layer and the second inter-layer insulation layer for forming the lower electrode with use of the hard mask as an etch mask, each hole having a circular shape and exposing one side of each storage node contact plug, wherein the depth of the exposed side of each storage node contact plug is preferably substantially the same as the thickness of the hard mask;
    performing an etch back process to remove the hard mask and a partial portion of each storage node contact plug exposed within the individual hole for use in the lower electrode; and depositing a material for use in the lower electrode into the removed partial portion of each storage node contact plug.

2. The method as recited in claim 1, wherein the storage node contact plug is made of polysilicon.

3. The method as recited in claim 1, further including the step of depositing the polysilicon layer on the insulation layer for forming the lower electrode.

4. The method as recited in claim 1, wherein the exposure of the one side of each storage node contact plug occurs within a range from about 0.1% to about 50% of the total depth of each storage node contact plug.

5. The method as recited in claim 1, wherein the partial portion of each storage node contact plug is etched to a depth allowing the each storage node contact plug to make a sufficient electric contact with the material deposited into the partial portion of each storage node contact plug.

* * * * *